(12) United States Patent
Pauer (10) Patent No.: US 12,184,045 B2
(45) Date of Patent: Dec. 31, 2024

(54) APPARATUS FOR PROVIDING AN ELECTRICAL CONNECTION TO AT LEAST ONE ELECTRICAL COMPONENT

(71) Applicant: MAGNA Powertrain GmbH & Co KG, Lannach (AT)

(72) Inventor: Michael Pauer, Sieggraben (AT)

(73) Assignee: MAGNA Powertrain GmbH & Co KG, Lannach (AT)

( * ) Notice: Subject to any disclaimer, the term of this patent is extended or adjusted under 35 U.S.C. 154(b) by 395 days.

(21) Appl. No.: 17/689,027

(22) Filed: Mar. 8, 2022

(65) Prior Publication Data

US 2022/0302685 A1   Sep. 22, 2022

(30) Foreign Application Priority Data

Mar. 19, 2021   (DE) ...................... 10 2021 202 723.7

(51) Int. Cl.
*H02B 1/20* (2006.01)
*H05K 1/02* (2006.01)

(52) U.S. Cl.
CPC ............. *H02B 1/20* (2013.01); *H05K 1/0256* (2013.01)

(58) Field of Classification Search
CPC ................................ H02B 1/20; H05K 1/0256
USPC ......................................................... 439/78
See application file for complete search history.

(56) References Cited

U.S. PATENT DOCUMENTS

| | | | |
|---|---|---|---|
| 5,471,089 A | 11/1995 | Nagatomo et al. | |
| 9,653,862 B2 | 5/2017 | Bittner | |
| 10,490,990 B2 * | 11/2019 | Nieberlein | ............... H02G 5/02 |
| 10,790,643 B2 * | 9/2020 | Velthuis | .................... H02B 1/21 |
| 2019/0237956 A1 * | 8/2019 | Nieberlein | ............... H02G 5/02 |

FOREIGN PATENT DOCUMENTS

| | | | | |
|---|---|---|---|---|
| CN | 200990477 Y | * | 12/2007 | |
| CN | 109314470 A | | 2/2019 | |
| CN | 111033996 A | | 4/2020 | |
| CN | 111033996 B | * | 3/2023 | ......... H01B 13/0036 |
| DE | 102016217723 A1 | * | 3/2018 | |
| DE | 102017115883 A1 | | 1/2019 | |
| DE | 102017217352 A1 | * | 3/2019 | ......... H01B 13/0036 |
| WO | 2018007202 A1 | | 1/2018 | |

* cited by examiner

*Primary Examiner* — Peter G Leigh
(74) *Attorney, Agent, or Firm* — Dickinson Wright PLLC (57) ABSTRACT

An apparatus for providing an electrical connection to at least one electrical component comprising a first busbar, a second busbar, wherein during the electrical operation the first busbar and the second busbar have a different potential with respect to one another and are arranged parallel to one another, a first insulation element and a second insulation element. The first insulation element and the second insulation element overlap in part in an axial direction but are arranged spaced from one another in the radial direction at least in part between the first busbar and the second busbar. In addition, at least the first busbar has a contacting means for providing an electrical contact to an electrical component, wherein the second insulation element is arranged in the region of the contacting means.

6 Claims, 10 Drawing Sheets

APPARATUS FOR PROVIDING AN ELECTRICAL CONNECTION TO AT LEAST ONE ELECTRICAL COMPONENT

CROSS-REFERENCE TO RELATED APPLICATIONS

This application claims priority to German Application No. DE 10 2021 202 723.7 filed Mar. 19, 2021. The entire disclosure of the above application is incorporated herein by reference.

FIELD OF INVENTION

The present invention relates to an apparatus for providing an electrical connection to at least one electrical component comprising a first busbar, a second busbar, wherein during the electrical operation the first busbar and the second busbar have a different potential with respect to one another and are arranged parallel to one another, and a first insulation element and a second insulation element, wherein the first insulation element and the second insulation element overlap in part in an axial direction but are arranged spaced from one another in the radial direction at least in part between the first busbar and the second busbar, wherein the first busbar has a contacting means for providing an electrical contact, wherein the second insulation element is arranged in the region of the contacting means.

BACKGROUND OF THE INVENTION

This section provides information related to the present disclosure which is not necessarily prior art Apparatuses of the above mentioned type generally have busbars that are arranged with a small spacing with respect to one another. The smaller the selected spacing between the busbars that have in each case different potentials during the electrical operation, the greater the risk of a short circuit in the form of a voltage flashover occurring owing to insufficiently designed air gaps or leakage paths between the two busbars. It is possible to prevent voltage flashovers of this type by installing an electrical insulation between the two busbars. For example, electrically insulating films which electrically insulate the busbars with respect to one another are used for busbars that have a small spacing with respect to one another.

The electrical connection of an electrical component having two busbars that lie opposite one another can be produced for example by means of a positive-locking connection or by means of a bonded connection.

In particular, in the case of a bonded connection such as, for example (laser or resistance) welding, it is not possible to use an electrically insulating insulation means in the region of the bonded connection of an electrical component having the busbars since this generally does not withstand the temperature input.

In order to overcome this, busbars that have a different potential during the electrical operation are designed and arranged remotely from one another (not overlapping) in such a manner that they are able to maintain air gaps and leakage paths without insulation means.

However, this increases the inductance and reduces the degree of efficiency.

SUMMARY OF THE INVENTION

This section provides a general summary of the disclosure, and is not a comprehensive disclosure of its full scope or all of its features It is an object of the invention to provide an improved apparatus for providing an electrical connection to at least one electrical component, which is characterized in particular in that it is possible to create an electrical connection to an electric component, with the resulting electrical connection being safe and reliable, having low-inductance and namely conforming to the air gap and leakage path requirements.

This objective is accomplished by the subject matter of the present invention in accordance with the independent claim 1. Advantageous embodiments of the present invention are described in the dependent claims.

An air gap in the electrical context is generally described as the shortest distance between two electrical conductors, in the present case the two busbars that have different potentials during the electrical operation. The leakage path in the electrical context describes the shortest distance along the surface of a (solid) insulating means between two electrical conductors, in other words busbars that have different potentials during the electrical operation.

The apparatus in accordance with the invention is used to provide an electrical connection to at least one electrical component and comprises a first busbar and a second busbar, wherein the first busbar and the second busbar during the electrical operation have a different potential with respect to one another and are arranged parallel to one another.

Furthermore, the apparatus in accordance with the invention comprises a first insulation element and a second insulation element, wherein the first insulation element and the second insulation element overlap in part in the axial direction but are arranged spaced from one another in the radial direction at least in part between the first busbar and the second busbar.

According to the present invention, at least the first busbar has a contacting means for providing an electrical contact, wherein the second insulation element is arranged in the region of the contacting means.

The design in accordance with the invention of the apparatus renders it possible for the two busbars that have a different potential during the electrical operation to be arranged to a large extent overlapping (in an axial and radial direction) and parallel to one another without limiting the degree of safety. The optimized insulation concept leads to a reduction in the inductance and to an improvement in the function of the apparatus, since a reduction in the inductance renders possible higher switching frequencies and consequently higher degrees of efficiency.

In accordance with one preferred embodiment of the appartus, the first insulation element is designed as an electrically insulating film, wherein the film is preferably arranged on a surface of the first busbar that faces the second busbar.

The second insulation element is preferably designed as an electrically insulating, moulded component.

The contacting means can be designed as a contacting opening for receiving a positive-locking and/or non-positive locking connection means, such as for example a screw or a bolt, by way of which the first busbar is electrically connected to a corresponding connection element of an electrical component or said contacting means can be designed as a contacting surface for providing a bonded, electrical connection to a corresponding connection element of the electrical component, for example by way of a (laser or resistance) welding process.

In accordance with another preferred embodiment of the apparatus, the contacting means is designed as a contacting opening and the second insulation element is preferably designed in a pot-shaped manner, wherein the contacting opening and an opening of the pot-shaped second insulation element overlap in an axial and radial direction.

In another particularly preferred embodiment of the apparatus, the contacting means is designed as a contacting surface on a surface of the first busbar that is remote from the second busbar, and the second insulation element is designed in such a manner that, in the region of the contacting surface, lying thereon said second insulation element lies against a surface of the first busbar that faces the second busbar.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations and are not intended to limit the scope of the present disclosure.

Figure 1:
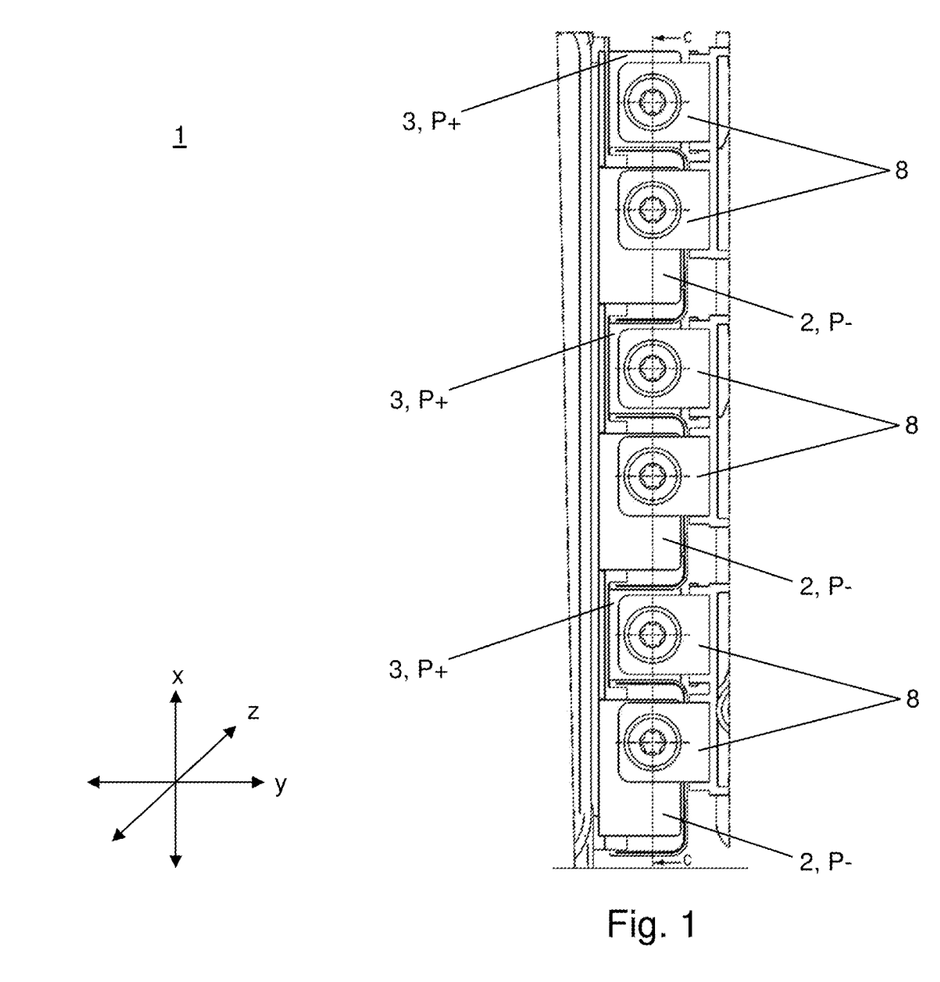
FIG. 1 illustrates a plan view of an apparatus in accordance with a first embodiment.
Figure 2:
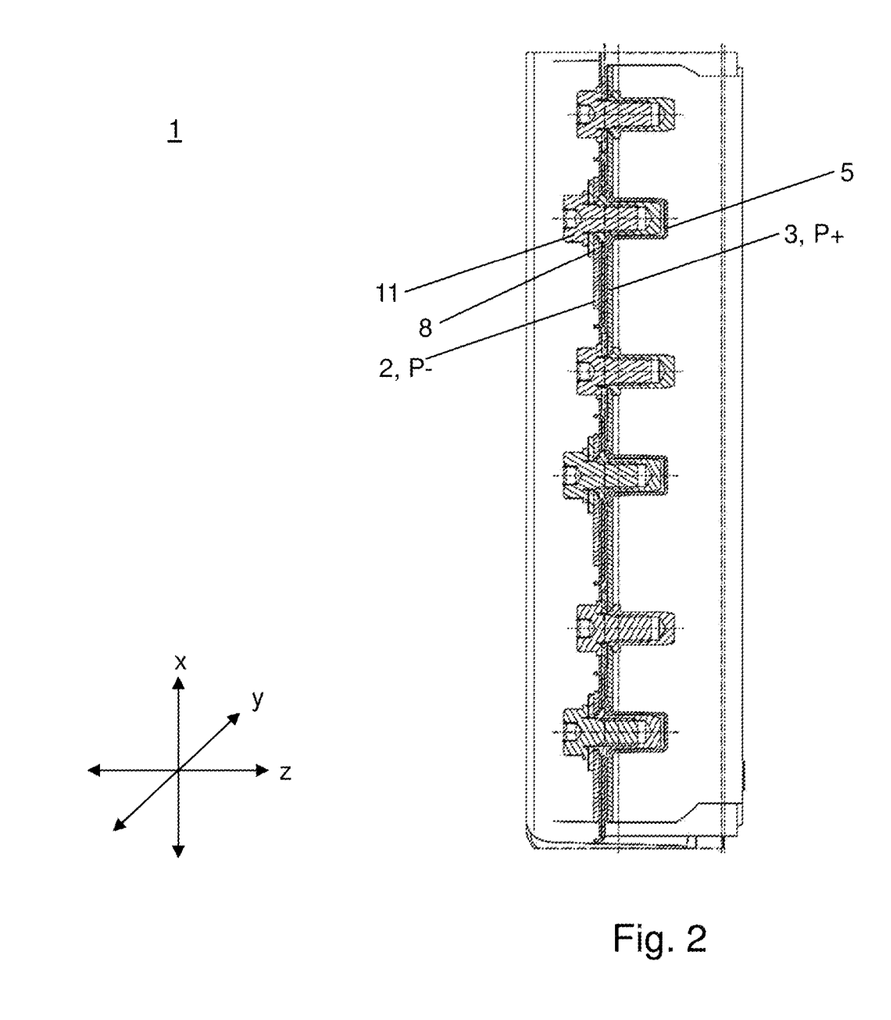
FIG. 2 illustrates a sectional view along the section plane C-C in accordance with FIG. 1.
Figure 3:
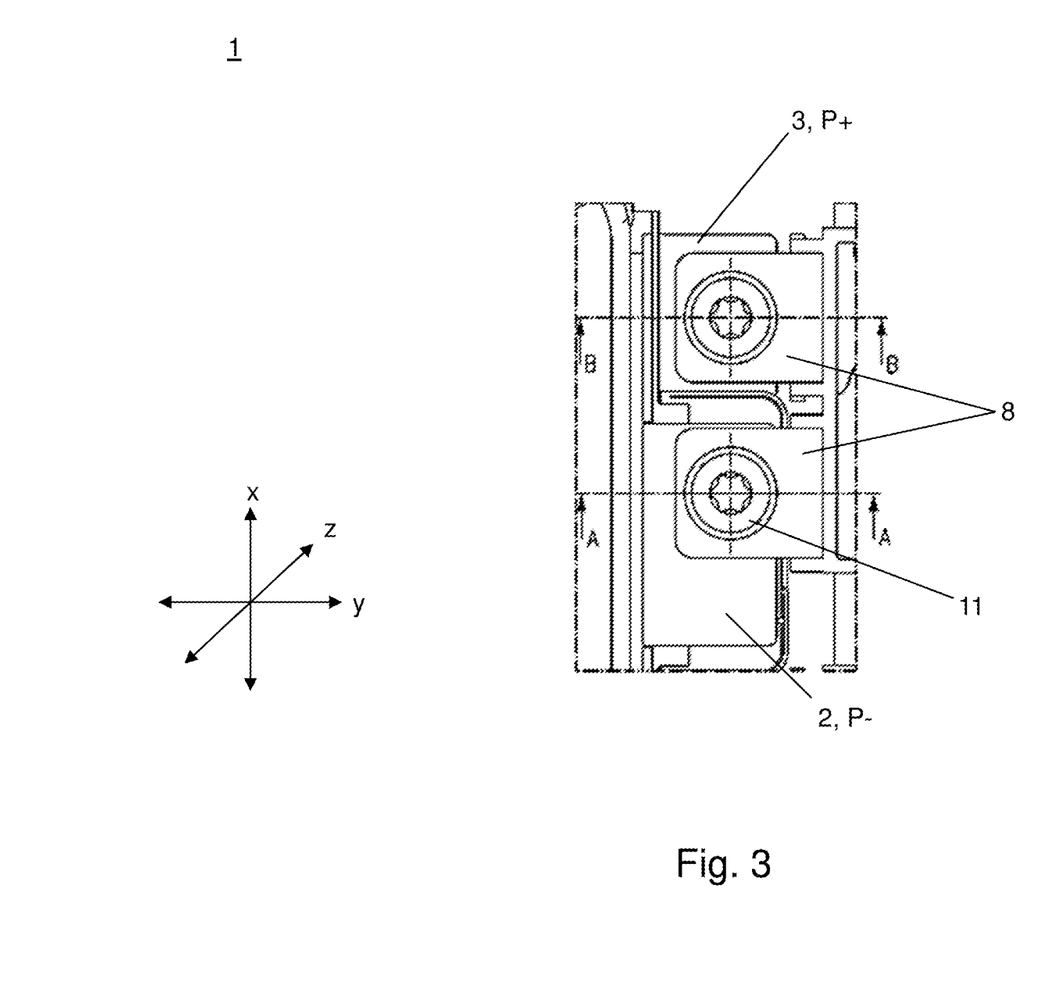
FIG. 3 illustrates a detailed view from FIG. 1.
Figure 4:
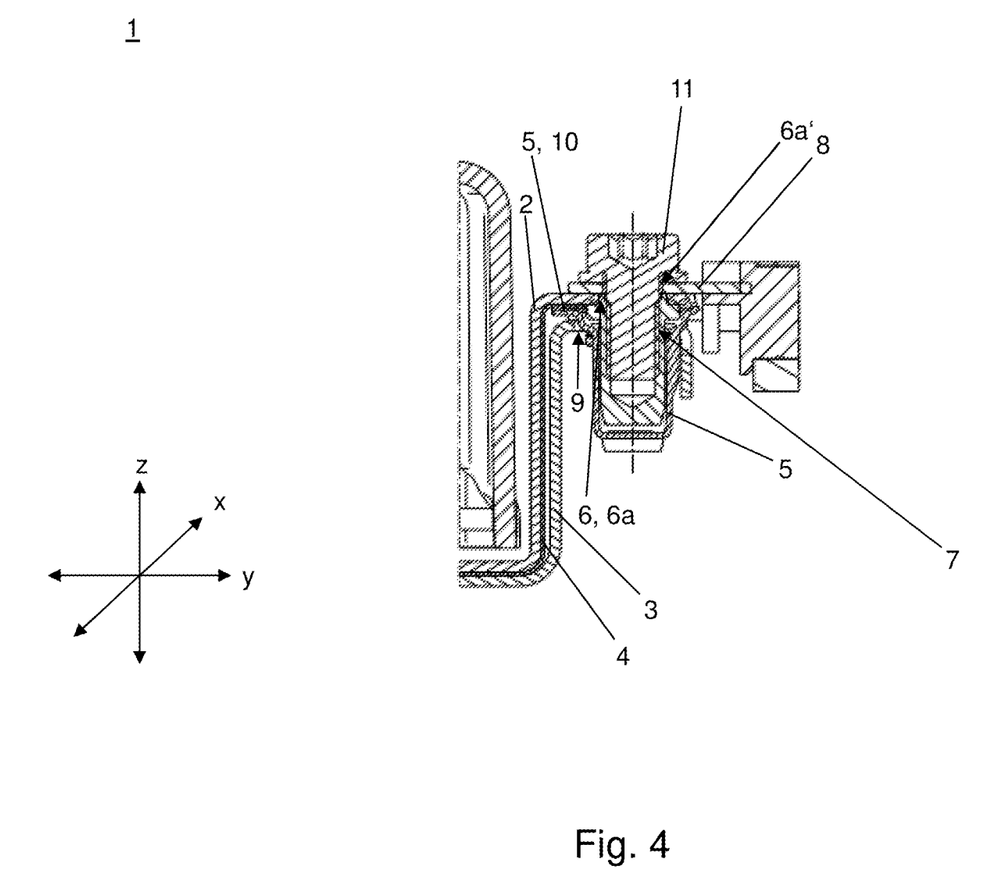
FIG. 4 illustrates a sectional view along the section plane A-A in accordance with FIG. 3.
Figure 5:
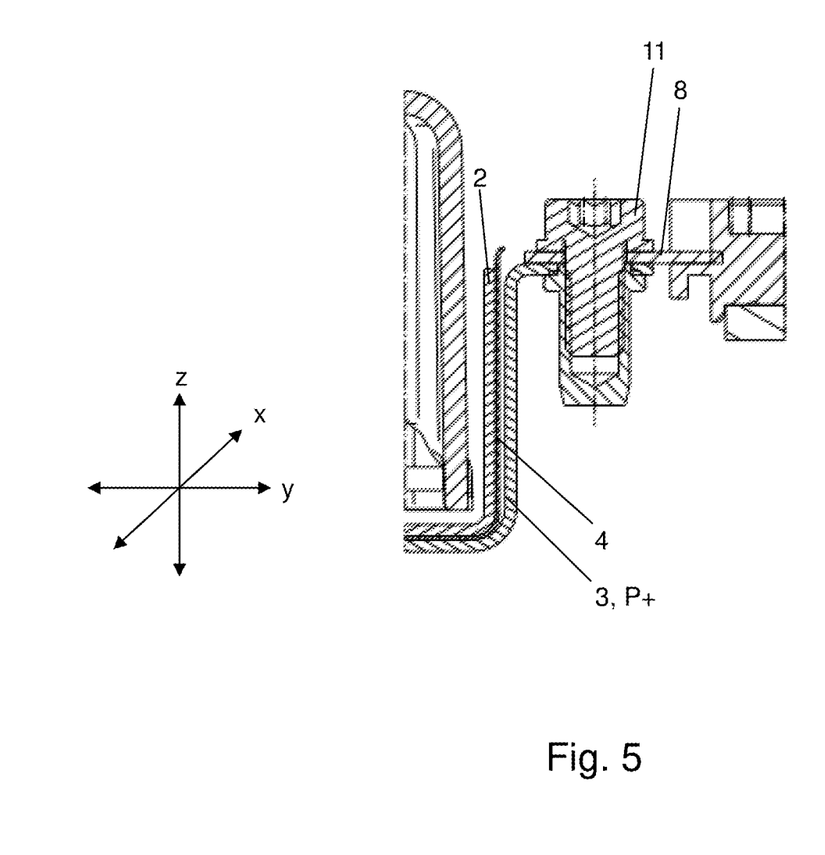
FIG. 5 illustrates a sectional view along the section plane B-B in accordance with FIG. 3.
Figure 6:
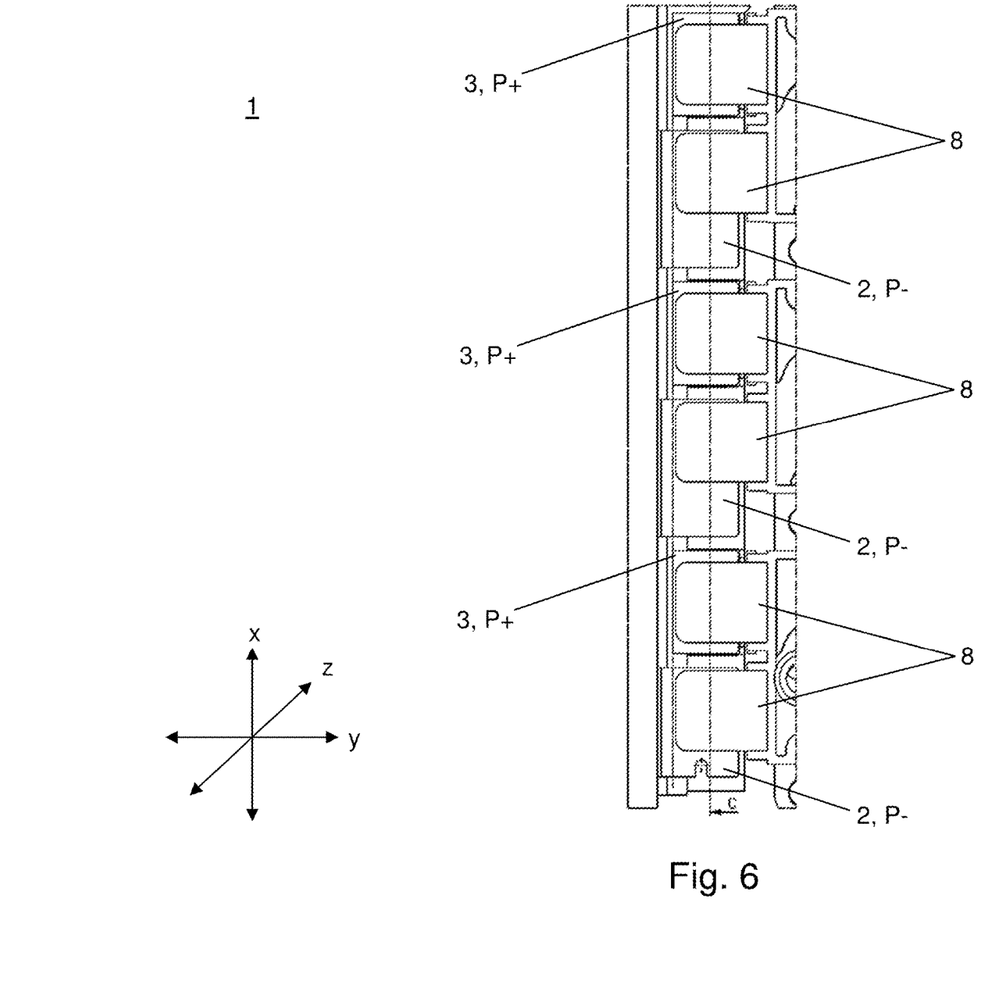
FIG. 6 illustrates a plan view of an apparatus in accordance with a second embodiment.
Figure 7:
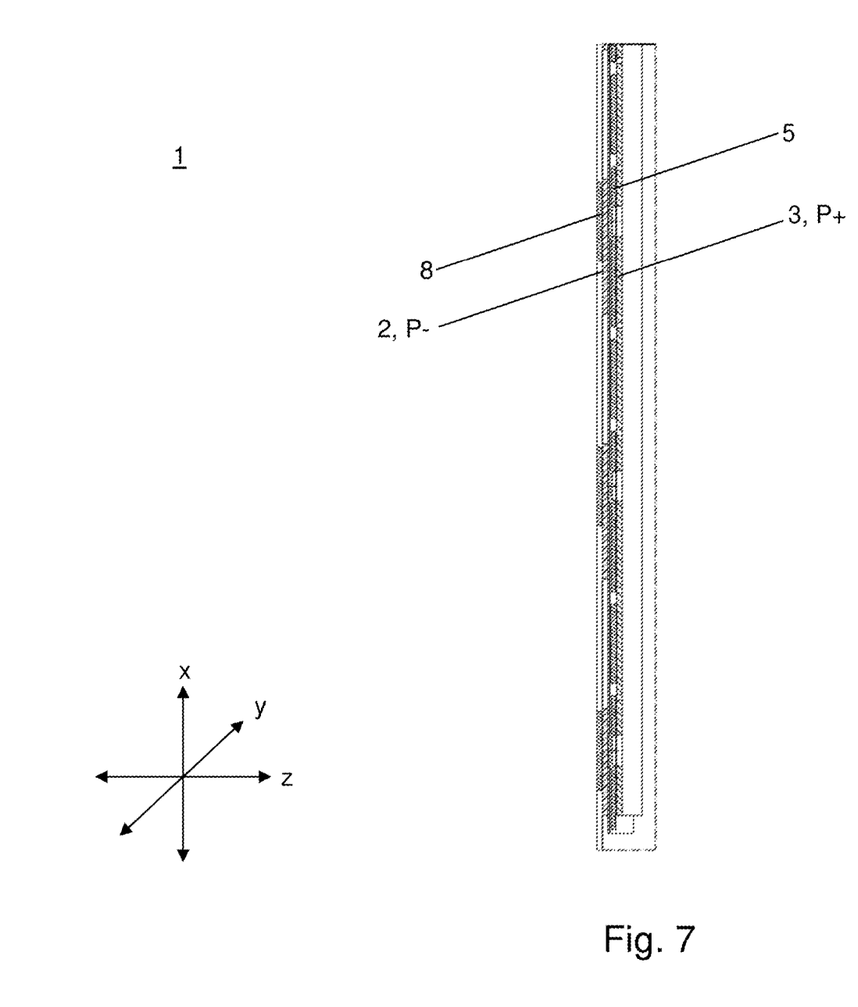
FIG. 7 illustrates a sectional view along the section plane C-C in accordance with FIG. 6.
Figure 8:
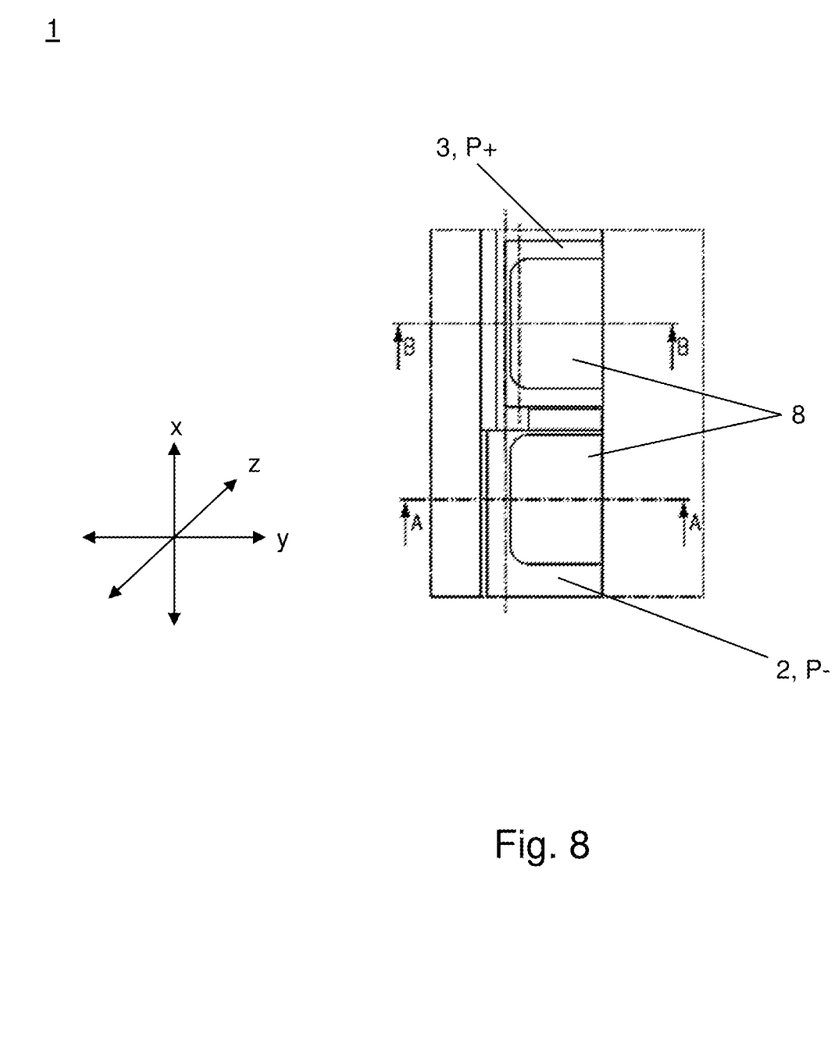
FIG. 8 illustrates a detailed view from FIG. 6.
Figure 9:
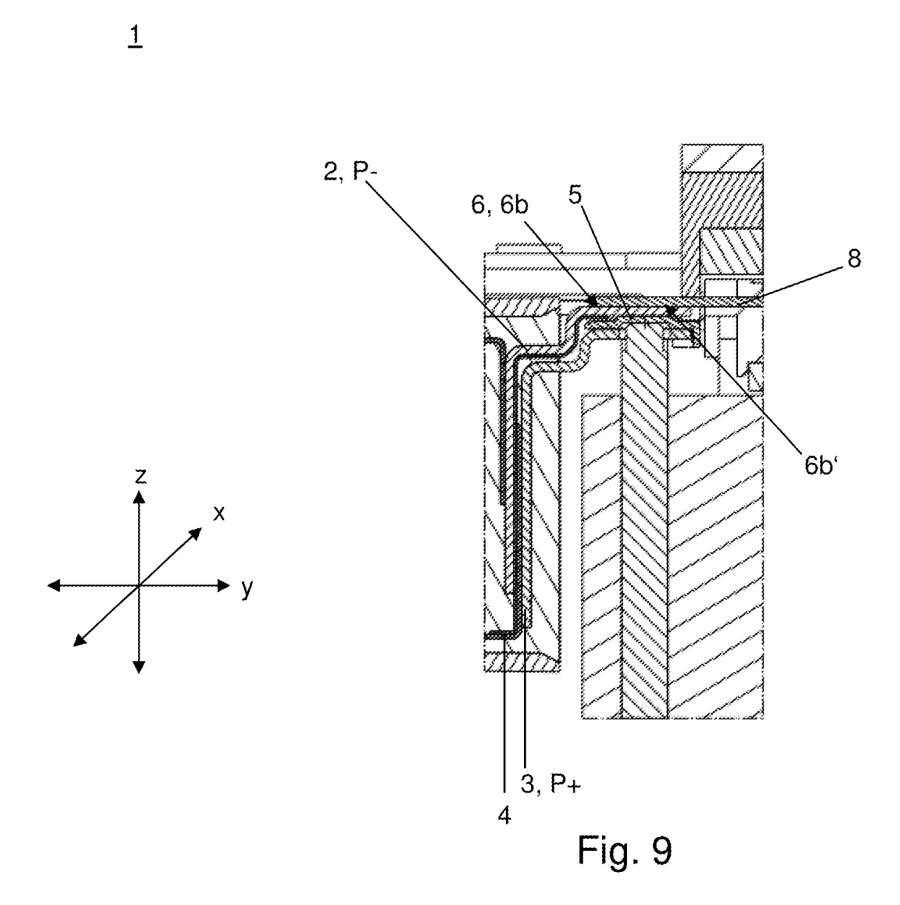
FIG. 9 illustrates a sectional view along the section plane A-A in accordance with FIG. 8.
Figure 10:
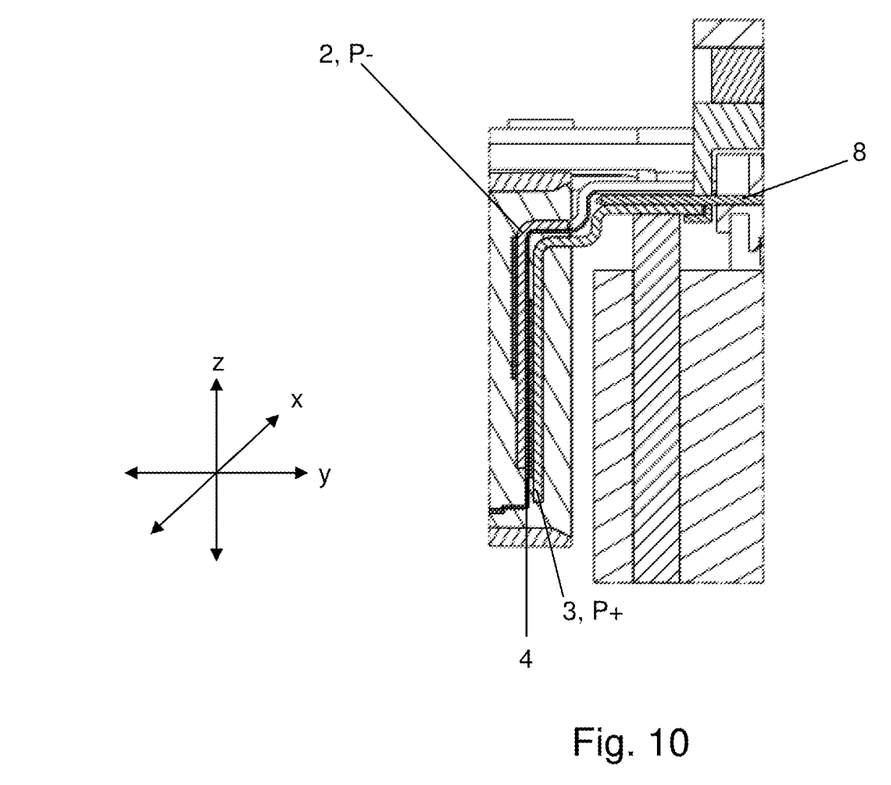
FIG. 10 illustrates a sectional view along the section plane B-B in accordance with FIG. 8.

FIG. 1 to FIG. 10 illustrate an apparatus 1 in accordance with the invention, wherein FIG. 1 to FIG. 5 illustrate a first embodiment of the apparatus 1 in accordance with the invention and FIG. 6 to FIG. 10 illustrate a second embodiment of the apparatus 1 in accordance with the invention.

The apparatus 1 is connected in both embodiments to an electrical component, namely a power module.

The apparatus 1 has two busbars, namely a first busbar 2 and a second busbar 3. During the electrical operation, the two busbars 2, 3 have a different potential P−, P+ with respect to one another. In the present case, the first busbar 2 has a negative potential P− and the second busbar 3 has a positive potential P+(FIG. 1, FIG. 3, FIG. 6, FIG. 8).

The first busbar 2 and the second busbar 3 are arranged parallel to one another, but spaced from one another in the radial direction, namely in the z-direction.

The direction specification "axial" corresponds to a direction along or parallel to the y-direction. The direction specification "radial" corresponds to a direction along or parallel to the z-direction.

Both busbars 2, 3 are connected to connection elements 8 of the power module in a positive-locking manner (first embodiment) or in a bonded manner (second embodiment). The connection elements 8 have a rectangular cross section. Furthermore, the connection elements 8 are spaced from one another in the x-direction and do not overlap (FIG. 1, FIG. 3, FIG. 6, FIG. 8). Depending upon the embodiment, they can each have a contacting opening 6a' or a contacting surface 6b'. The geometric design of the busbars 2, 3 is kept simple in both illustrated embodiments, i.e. no embossing or beads are necessary, in order to produce the bonded or positive-locking or non-positive locking and electrical connection. As a consequence, it is possible to realize a design which is optimized with regard to production processes, tolerances and costs.

Two insulation elements, namely a first insulation element 4 and a second insulation element 5, are arranged between the first busbar 2 and the second busbar 3. The insulation elements 4, 5 have the task of electrically insulating the two busbars 2, 3 with respect to one another.

The first insulation element 4 and the second insulation element 5 are arranged overlapping in an axial direction, in other words in the y-direction, but are spaced from one another in a radial direction, in other words in the z-direction, at least in part (depending upon the respective embodiment) between the first busbar 2 and the second busbar 3.

At least the first busbar 2 has a contacting means 6 for providing an electrical contact to the power module, more precisely to its respective connection element 8. The second insulation element 5 is arranged in the region of the contacting means 6.

The first insulation element 4 is designed in both embodiments of the apparatus 1 as an electrically insulating film that is arranged on a surface of the first busbar 2 that is facing the second busbar 3, namely is laminated or adhered thereto. The second insulation element 5 is designed as an electrically insulating, moulded component. In the two present embodiments as a synthetic material injection moulded part.

In the first non-limiting embodiment of the apparatus 1 in accordance with FIG. 1 to FIG. 5, the contacting means 6 is designed as a contacting opening 6a and is suitable for receiving a positive-locking and/or non-positive locking connection means 11 by way of which the apparatus 1 is electrically connected to the power module, more precisely to the respective connection element 8 of the power module. In the present first embodiment, the connection means 11 is designed as a screw.

This screw requires the contact opening 6a of the first busbar 2 and a lead-through opening 9 of the opposite-lying second busbar 3, which runs parallel to the first busbar 2, wherein the lead-through opening 9 and the contact opening 6a overlap in an axial and radial direction. Furthermore, the respective connection element 8 has a corresponding contacting opening 6a'.

The second insulation element 5 is designed as an electrically insulating, moulded component essentially in a pot-shaped manner having a collar 10, wherein the collar 10 extends essentially in an axial direction, in other words in the z-direction, starting from an opening 7 of the pot-shaped second insulation element 5 between the two busbars 2, 3. The pot-shaped part of the second insulation element 5 extends through the lead-through opening 9 of the second busbar 3. The opening 7 of the pot-shaped second insulation element 5 overlaps in the axial and radial direction with the contacting opening 6a of the first busbar 2 and of the contacting opening 6a' of the connection element 8. The top-shaped design of the second insulation element 5, which is closed on one side, renders it possible to fulfil the requirements with regard to technical cleanliness, since it is possible when providing the screw connection, for example, for particles to become detached in the nut thread or screw thread and to pass into the interior space, i.e. into the region between the first busbar 2 and the second busbar 3 in which in particular the first insulation element 4 is arranged.

In the case of the second non-limiting embodiment in accordance with FIG. 6 to FIG. 10, the contacting means 6 is designed as a contacting surface 6b and is suitable for providing the bonded (electrical) connection to the power module, more precisely to the respective connection element 8 of the power module. The contacting surface 6b is provided on the first busbar 2 on a surface of the first busbar 2 that is remote from the second busbar 3. The second insulation element 5 is arranged in such a manner that, in the region of the contacting surface 6b, lying thereon said second insulation element lies against a surface of the first busbar 2 that is remote from the second busbar 3.

The second embodiment of the apparatus 1 is suitable therefore for providing a bonded connection, in the present case for welding, the contacting surface 6b to a suitably designed respective connection element 8 of the power module.

The second insulation element 5 is designed accordingly geometrically and in terms of material technology, so that it withstands the thermal load during (fusing) welding without damage.

What is claimed is:

1. An apparatus for providing an electrical connection to at least one electrical component, comprising:
   a first busbar;
   a second busbar;
   wherein the first busbar and the second busbar during electrical operation have a different potential with respect to one another and are arranged parallel to one another,
   a first insulation element; and
   a second insulation element,
   wherein the first insulation element and the second insulation element overlap in part in an axial direction but are arranged spaced from one another in a radial direction at least in part between the first busbar and the second busbar, wherein at least the first busbar has a contacting means for providing an electrical contact to an electrical component, wherein the second insulation element is arranged in the region of the contacting means and wherein the first insulation element is designed as an electrically insulating film.

2. The apparatus according to claim 1,
   wherein the film is arranged on a surface of the first busbar that is facing the second busbar.

3. The apparatus according to claim 1,
   wherein the second insulation element is designed as an electrically insulating, moulded component.

4. The apparatus according to claim 1,
   wherein the contacting means is designed as a contacting opening for receiving a positive-locking and/or non-positive locking connection means or as a contacting surface for providing a bonded connection to a connection element.

5. The apparatus according to claim 4,
   wherein the contacting means is a contacting opening and the second insulation element is designed in a pot-shaped manner, and wherein the contacting opening and an opening of the pot-shaped, the second insulation element overlap in an axial and radial direction.

6. The apparatus according to claim 4,
   wherein the contacting means is a contacting surface on a surface of the first busbar that is remote from the second busbar, and wherein the second insulation element is designed in such a manner that, in the region of the contacting surface, lying thereon the second insulation element lies against a surface of the first busbar that is remote from the second busbar.

* * * * *